(12) United States Patent
Unterricker

(10) Patent No.: US 6,362,693 B2
(45) Date of Patent: Mar. 26, 2002

(54) FREQUENCY DETECTION METHOD FOR ADJUSTING A CLOCK SIGNAL FREQUENCY AND A FREQUENCY DETECTOR CIRCUIT FOR CARRYING OUT THE METHOD

(75) Inventor: Reinhold Unterricker, Vaterstetten (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/817,841

(22) Filed: Mar. 26, 2001

Related U.S. Application Data

(63) Continuation of application No. PCT/DE99/02766, filed on Sep. 1, 1999.

(51) Int. Cl.⁷ .............................. H03L 7/85; H03L 7/87
(52) U.S. Cl. .............................. 331/11; 331/25; 331/27; 327/42; 327/48
(58) Field of Search .............................. 331/11, 25, 27; 327/42, 48

(56) References Cited

U.S. PATENT DOCUMENTS

| | | | |
|---|---|---|---|
| 5,278,874 A | 1/1994 | Liu et al. ............... | 375/120 |
| 5,363,419 A | 11/1994 | Ho ........................ | 375/120 |
| 5,487,093 A | 1/1996 | Adresen et al. ........ | 375/376 |
| 5,512,860 A | 4/1996 | Huscroft et al. ........ | 331/1 A |
| 5,799,049 A * | 8/1998 | McFarland et al. ..... | 375/362 |
| 6,029,055 A * | 2/2000 | Nobusawa .............. | 455/259 |

FOREIGN PATENT DOCUMENTS

| | | |
|---|---|---|
| EP | 0 043 407 A2 | 2/1982 |
| WO | WO 98/43356 | 10/1998 |

OTHER PUBLICATIONS

David G. Messerschmitt: "Frequency Detectors for PLL Acquisition in Timing and Carrier Recovery", IEEE Transactions on Communications, vol. COM–27, No. 9, Sep. 1979, pp. 1288–1295.

Sam Yinsang Sun: "A High Speed High Jitter Tolerant Clock and Data Recovery Circuit Using Crystal Based Dual PLL", IEEE 1991 Bipolar Circuits and Technology Meeting 12.4, pp. 293–296.

Ansgar Pottbäcker et al.: "A Si Bipolar Phase and Frequency Detector IC for Clock Extraction up to 8 Gb/s", IEEE Journal of Solid–State Circuits, vol. 27, No. 12, Dec. 1992, pp. 1747–1751.

* cited by examiner

*Primary Examiner*—Siegfried H. Grimm
(74) *Attorney, Agent, or Firm*—Herbert L. Lerner; Laurence A. Greenberg; Werner H. Stemer

(57) ABSTRACT

In a frequency detection method for adjusting a clock signal frequency to the data rate of a received data signal, the clock signal which is predivided by a factor of 4. The predivided clock signal and the received data signal are each frequency-divided by the same division factor. The frequencies of the two frequency-divided signals are then determined by counting processes and are compared by a subtractor. The frequency difference that is determined is then converted into an analog output signal for controlling the clock signal frequency. This method can be applied in the transmission of data.

23 Claims, 1 Drawing Sheet

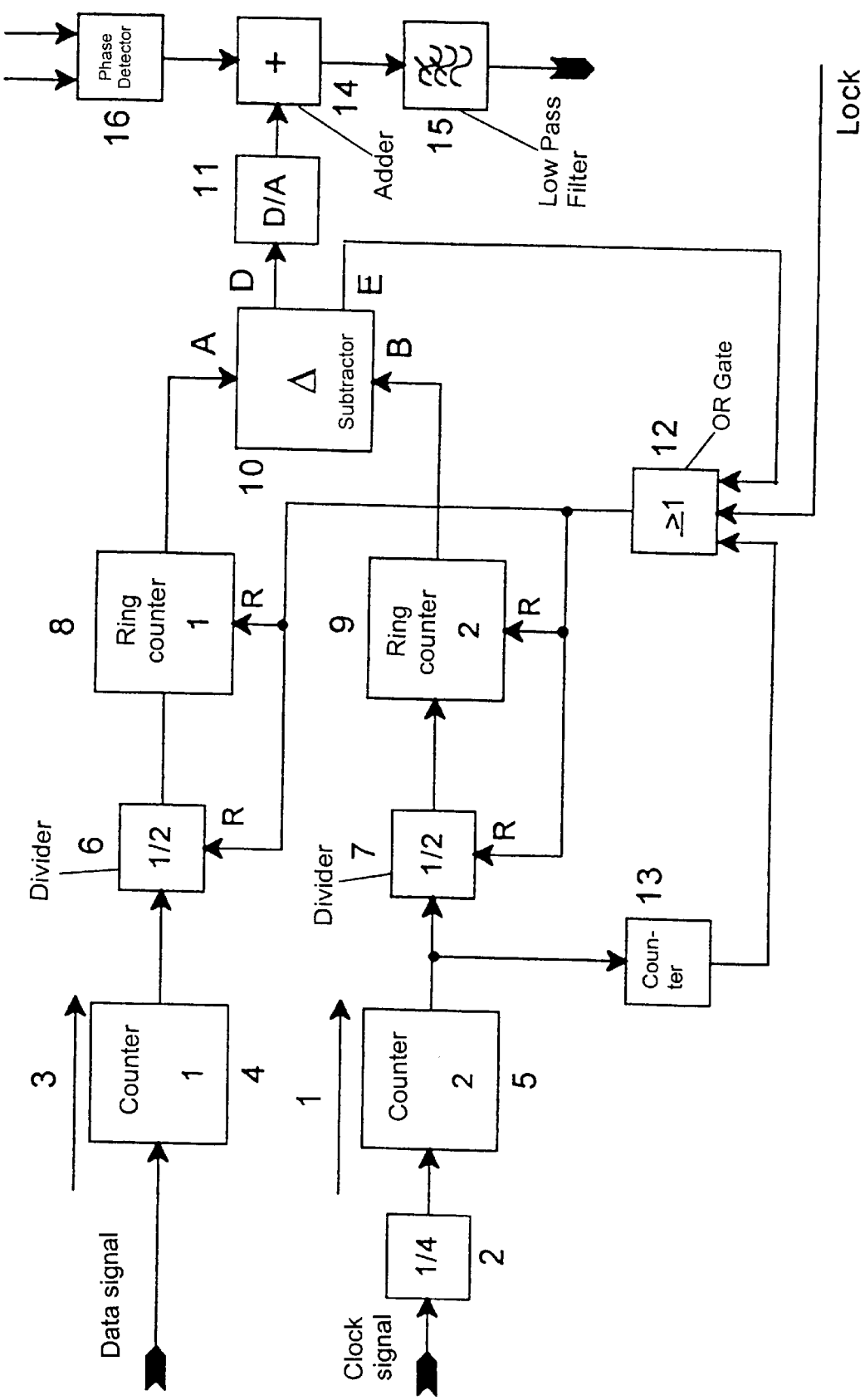

FREQUENCY DETECTION METHOD FOR ADJUSTING A CLOCK SIGNAL FREQUENCY AND A FREQUENCY DETECTOR CIRCUIT FOR CARRYING OUT THE METHOD

CROSS-REFERENCE TO RELATED APPLICATION

This application is a continuation of copending International Application No. PCT/DE99/02766, filed Sep. 1, 1999, which designated the United States.

BACKGROUND OF THE INVENTION

Field of the Invention

The invention relates to a frequency detection method for adjusting the clock signal frequency of a local oscillator to the data rate of a received binary data signal. The invention also relates to a frequency detector circuit for carrying out the method.

For synchronizing clock signals, a PLL (phase locked loop) is frequently used in which the clock signal phase of a local oscillator is compared by a phase detector with the phase position of the received data signal and is adjusted. Because a phase locked loop does not lock if the frequency of the local oscillator differs too greatly from the data rate, a frequency comparison, by means of which the oscillator frequency is pretuned, must also be carried out.

A method which is known in this context, and which is described in the paper by A. Pottbäcker et al: "A Si Bipolar Phase And Frequency Detector IC For Clock Extraction Up To 8 Gb/s" in "IEEE J. Sol.-State circuits", Vol. 27, No. 12, December 1992, pp 1747–1751 and in the paper by D. G. Messerschmitt: "Frequency Detectors For PLL Acquisition In Timing And Carrier Recovery" in "IEEE Trans. Comm. Vol. COM-27, No. 9, September 1979, pp 1288–1295, is to use sequential circuits, for example of the rotation frequency detector, which samples a normal and a quadrature signal clock, i.e. a signal clock delayed by 90°, with the data signal in order to acquire the frequency information.

Because received data signals are usually subject to more or less severe jitter, this method is in practice suitable only to a certain degree. When the jitter is severe, the frequency detector supplies incorrect information and can disrupt the clock signal synchronization even after the locking process has already occurred.

In order to avoid this problem, in other approaches, a reference signal with quartz precision is used, with which signal the local oscillator is tuned into the locking-in range of the phase locked loop. The disadvantage of this method, which is known, for example, from the paper by Sam Yinshang Sun: "A High Speed High Jitter Tolerant Clock And Data Recovery Circuit Using Crystal Based Dual PLL" in "IEEE 1991 Bipolar Circuits And Technology Meeting", pp 293–296, is that a reference signal has to be supplied or generated with a quartz.

BRIEF DESCRIPTION OF THE DRAWINGS

It is accordingly an object of the invention to provide a frequency detector circuit and a frequency detection method for adjusting the clock signal of a local oscillator to the data rate of a received binary signal which overcomes the above-mentioned disadvantages of the prior art circuits and methods of this general type. In particular, it is an object of the invention to provide a method and a circuit to reliably compare the data rate of a received data signal and the clock signal frequency of a local oscillator without disruption even when there is severe jitter on the received data signal, and without having to generate a reference signal which has quartz precision with a quartz.

With the foregoing and other objects in view there is provided, in accordance with the invention a frequency detection method for adjusting a clock signal frequency of a local oscillator to a data rate of a received binary data signal with a signal edge change probability of ½. The method includes steps of: obtaining a clock signal having a frequency from a local oscillator; frequency dividing the clock signal by a first division factor of 4 to obtain a first frequency divided clock signal; frequency dividing the first frequency divided clock signal by a second division factor to obtain a second frequency divided clock signal, and frequency dividing a received data signal by the second division factor to obtain a frequency divided data signal (the received data signal and the frequency divided clock signal are divided by the same division factor); determining a frequency of the second frequency divided clock signal and determining a frequency of the frequency divided data signal by running counting processes simultaneously in parallel in counters which provide two counter signals; in a subtractor, comparing the frequency of the second frequency divided clock signal with the frequency of the frequency divided data signal by obtaining a difference between the two counter signals; converting the difference obtained by the subtractor into an analog output signal; and using the analog output signal to control the frequency of the clock signal of the local oscillator.

In transmission systems, the user information is usually scrambled because this is a way of improving the spectral properties of the data signal for the transmission. The probability that the state of a data signal bit will change at a possible time is ½ in this case. This property is used in the method according to the invention and exploited in order to obtain frequency information.

A reset signal, which resets the counters operating in parallel and avoids an overflow at the subtractor, is advantageously derived from the final reading of the subtractor.

In accordance with an added feature of the invention, after frequency adjustment of the clock signal of the local oscillator has taken place, the clock signal phase of the local oscillator is compared with the phase position of the received data signal by means of a PLL (phase locked loop) provided with a phase detector and a loop low-pass filter and adjusted. The analog output signal is fed to the loop low-pass filter in the PLL via an adder during the frequency adjustment, as a result of which the clock signal frequency of the local oscillator is modified until it has adjusted to the data rate of the received data signal.

When the PLL locks, a lock signal, which is fed as a reset signal to the counters operating in parallel is then advantageously derived, with the result that the frequency controlling process is terminated. The PLL then starts its phase control operation.

In accordance with an additional feature of the invention, after a specified number of clock signal pulses, a reset pulse which resets the counters operating in parallel, with the result that the frequency control process is switched off, is output by a counter designated as a plesiochronous counter.

With the foregoing and other objects in view there is also provided, in accordance with the invention, a frequency detector circuit that includes a clock signal path for dividing a frequency of a clock signal applied to the clock signal path from a local oscillator. The clock signal path includes, in series, a 1:4 frequency divider, then a precounter, and finally a ring counter having an output providing a counting value. A data signal path is provided for dividing a frequency of a received binary data signal. The data signal path includes, in series, a precounter that is identical to the precounter in the clock signal path, and a ring counter having an output providing a counting value. The ring counter in the data signal path is identical to the ring counter in the clock signal path. A subtractor has a first input connected to the output of the ring counter in the clock signal path and a second input connected to the output of the ring counter in the data signal path. The subtractor outputs a difference between the counting value output by the ring counter in the clock signal path and the counting value output by the ring counter in the data signal path. A digital to analog converter receives the difference from the subtractor and converts the difference into an analog output signal for controlling the frequency of the clock signal of the local oscillator.

Here, a 1:2-frequency divider is expediently connected in each case between the precounter and the ring counter both in the clock signal path and in the data signal path.

The subtractor is advantageously designed in such a way that it also forms the difference between the counting values at its two inputs beyond the overflow limits of the ring counter. In addition, the subtractor also has a further output at which a reset signal is present if the subtractor reaches a specified positive or negative final reading.

The reset signal is transmitted to the two ring counters and to the two 1:2-frequency dividers, in each case to their reset input. The reset signal can additionally be transmitted to the two precounters, in each case to their reset input. The aforesaid reset signals and possibly also a lock signal which is output by a phase locked loop when locking occurs after a frequency adjustment of the clock signal frequency of the local oscillator has been terminated, are also additionally conducted via an OR gate before being fed to the reset inputs for counters and dividers.

Other features which are considered as characteristic for the invention are set forth in the appended claims.

Although the invention is illustrated and described herein as embodied in a frequency detection method for adjusting a clock signal frequency and frequency detector circuit for carrying out the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The sole drawing FIGURE shows a frequency detector circuit for carrying out the inventive method.

DESCRIPTION OF THE PREFERRED EMBODIMENTS

Referring now to the sole drawing FIGURE, there is shown a local oscillator providing a clock signal that is inserted into a clock signal path 1. The clock signal of the local oscillator is first divided in a 1:4 frequency divider 2 by the division factor "4", with the result that the frequency which occurs then corresponds to the center of frequency of a received, binary data signal with edge change density ½. The received, binary data signal is fed into a data signal path 3. A precounter 4 and 5, respectively, is provided in each case in the data signal path 3 and in the clock signal path 1. The two precounters 4 and 5 are provided to average out relatively long identical or 0–1 frequencies with brief signal edge change density 0 or 1.

The output signals of the precounters 4 and 5 are divided once more by 2 in a 1:2frequency divider 6 or 7 and increment, in each case, a downstream ring counter 8 or 9, which count, for example, with 4 bits from 0 to 15 and then start at 0 again. A subtractor 10 has two inputs A and B, at which the output counting signals of the two ring counters 8 and 9 of the clock signal path 1 and of the data signal path 3 are fed. The subtractor 10 operates as stated in the book by U. Tietze; Ch. Schenk: "Halbleiter-Schaltungstechnik [Semiconductor circuit technology]", seventh, revised edition, Springer Verlag [publishing house], Berlin, 1985, page 247.

The subtractor 10 forms at its output D the difference between the ring counter readings fed to the inputs A and B, even beyond the overflow limits. For example with a 4-bit subtractor 10, both 4-1 and 2-15 yield the difference 3. A digital/analog converter 11 connected to the output D of the subtractor 10 converts the counter difference into an analog voltage, the most significant bit being used as a sign bit for the two's complement. An example of this is given below: 0000=0 mV, 0001=10 mV, 0110=60 mV, 1111=−10 mV, 1100=−30 mV. The further output E of the subtractor 10 outputs a reset signal if the counter reading $2^{n-1}-1$ (for example 0111=7) or $-2^{n-1}$ (for example 1000=−8) is reached.

The reset signal is logically connected via an OR gate 12 to the reset signal of a plesiochronous counter 13. The plesiochronous counter 13 is so named because it resets the frequency detector into the initial state with an almost synchronous data and clock signal, and with a possibly usable lock signal of a PLL, and transmits it to the two 1:2 dividers 6 and 7 and the two ring counters 8 and 9. The reset inputs are each designated in the figure by R.

In a variant which is not separately shown in the figure, the reset signal can additionally be transmitted to the precounters 4 and 5. By means of an adder 14, the analog output voltage is transmitted to the loop low-pass filter 15 of the PLL which has a phase detector 16 for phase tracking and phase synchronizing the clock signal of the local oscillator.

For the functional description which now follows of the frequency adjustment circuit illustrated schematically in the figure, it is first assumed that the data signal rate is higher than the clock signal frequency. In this case, the precounter 4 which is located in the data signal path 3 will supply pulses with a higher frequency than the precounter 5 configured in the clock signal path 1. For this reason, the ring counter 8 will count more quickly via the 1:2 divider 6 than the ring counter 9, with the result that a value which rises as a function of the difference frequency is output at the output D by the subtractor 10.

The digital/analog converter 11 generates a positive analog voltage from the value output by the subtractor 10. The positive analog voltage is transmitted via the adder 14 to the loop low-pass filter 15. As a result, the clock frequency of the local oscillator is increased until it has adjusted to the data signal rate. The signal of the phase detector 16 in the PLL does not play any role here because it supplies the average value 0 when the PLL is not locked.

If the subtractor 10 reaches the positive or negative final reading, for example +7, or in the event of an excessively high oscillator frequency −8, a reset pulse is generated at its output E and the reset pulse resets the ring counters 8 and 9 and the 1:2 dividers 6 and 7 via their reset inputs R. As a result, a new counting process is started and a difference with an incorrect sign is prevented from being formed.

If the PLL locks because of the frequency adjustment by means of the signal of the phase detector 16, and if, as a result, a lock signal is generated, this can be used to terminate the frequency control process. In this case it is possible to dispense with the so-called plesiochronous counter 13. A possible circuit for a lock indicator is a window comparator which outputs a signal if the voltage of the phase detector 16 does not exceed certain limits for a sufficiently long time.

If there is no lock signal available, the plesiochronous counter 13 assumes the function of preventing possible disruptive actions of the frequency detector if the PLL is already locked. The output signal of the precounter 4 is more or less irregular as a result of statistically distributed bit change frequencies or identical sequences. Without regular resetting of the ring counters 8 and 9, their counter readings would gradually "run away from one another" and generate faulty frequency detector signals.

For this reason, after a certain number of clock pulses, a reset pulse which resets the ring counters 8 and 9 is output by the plesiochronous counter 13. The greater the plesiochronous counter 13, the more precise the control of the frequency; and at the same time the sensitivity to deviations of the data signal from the edge change density ½ rises.

Because the divided data signal is, by its very nature, not regular, the output pulses of the precounters 4 and 5 can occur with a random shift with respect to one another. In order to prevent this from causing the frequency detector to generate an output signal, the 1:2-frequency dividers 6 and 7 are inserted and they are reset by the plesiochronous counter 13, by the lock signal, or by the signal of the output E of the subtractor 10.

A few essential dimensioning rules for the frequency control circuit illustrated in the figure will now be given:

For the precounters 4 and 5, the following applies: in order to make the circuit tolerant to g successive identical bits, the precounter must count to g/4.

For the plesiochronous counter 13, the following applies: a reset pulse will be generated by this counter 13 before the ring counters 8 and 9 have a difference of 1 if the frequency difference $\Delta f$ is present at the input. The beat frequency between the ring counter inputs is $\Delta f/8VZ$, where VZ is the precounter step of the precounters 4 and 5. PZ which is subsequently given is the steps of the plesiochronous counter 13.

In order to obtain this frequency at the output of the plesiochronous counter 13, the following must apply: $(\Delta f/8VZ)*(4VZ)*(PZ)=f_{clock}$ or $PZ=2\ f_{clock}/\Delta f$. If, for example, the locking-in range of the PLL is dimensioned at 10 MHz, and if the clock frequency is $f_{clock}=1$ GHz, the plesiochronous counter 13 must count up to 200.

For the ring counters 8 and 9 the following applies: with large ring counters 8 and 9, a linearly operating frequency control loop can be set up; the manipulated value becomes proportional to the difference frequency. As a result, an optimum frequency locking-in behavior can be obtained. If low requirements are made of the frequency locking-in behavior, a simple 3-bit or 4-bit counter is sufficient. A 2-bit counter is not possible because of the resetting output E.

For the frequency control loop the following applies: in order to make the frequency control stable, the annular amplification must not be too large. The output signal of the digital/analog converter 11 must therefore not be too large. An analytic stability calculation is dispensed with at this point.

The described frequency adjustment circuit according to the invention is used in particular in receiver circuits at the end of transmission links of a telecommunications and data transmission network.

I claim:

1. A frequency detection method for adjusting a clock signal frequency of a local oscillator to a data rate of a received binary data signal with a signal edge change probability of ½, the method which comprises:

obtaining a clock signal having a frequency from a local oscillator;

frequency dividing the clock signal by a first division factor of 4 to obtain a first frequency divided clock signal;

frequency dividing the first frequency divided clock signal by a second division factor to obtain a second frequency divided clock signal, and frequency dividing a received data signal by the second division factor to obtain a frequency divided data signal;

determining a frequency of the second frequency divided clock signal and determining a frequency of the frequency divided data signal by running counting processes simultaneously in parallel in counters which provide two counter signals;

in a subtractor, comparing the frequency of the second frequency divided clock signal with the frequency of the frequency divided data signal by obtaining a difference between the two counter signals;

converting the difference obtained by the subtractor into an analog output signal; and using the analog output signal to control the frequency of the clock signal of the local oscillator.

2. The frequency detection method according to claim 1, which comprises:

deriving a reset signal from a final reading of the subtractor; and using the reset signal to reset the counters operating in parallel and to prevent an overflow in the subtractor.

3. The frequency detection method according to claim 2, which comprises:

providing a phase locked loop with a phase detector and a loop low-pass filter; and after the frequency of the clock signal of the local oscillator has been adjusted, comparing a phase of the clock signal of the local oscillator with a phase position of the received data signal using the phase locked loop, and adjusting the phase of the clock signal of the local oscillator.

4. The frequency detection method according to claim 1, which comprises:

providing a phase locked loop with a phase detector and a loop low-pass filter; and after the frequency of the clock signal of the local oscillator has been adjusted, comparing a phase of the clock signal of the local oscillator with a phase position of the received data signal using the phase locked loop, and adjusting the phase of the clock signal of the local oscillator.

5. The frequency detection method according to claim 4, which comprises:
   when the phase locked loop locks, deriving a lock signal; and
   feeding the lock signal as a reset signal to the counters operating in parallel to terminate the control of the frequency of the clock signal of the local oscillator.

6. The frequency detection method according to claim 4, which comprises using an adder to feed the analog output signal to the loop low-pass filter in the phase locked loop, as a result of which the frequency of the clock signal of the local oscillator is modified until it has adjusted to a data rate of the received data signal.

7. The frequency detection method according to claim 4, which comprises:
   providing a plesiochronous counter;
   after a number of clock signal pulses have been detected from the plesiochronous counter, outputting a reset pulse to reset the counters which operate in parallel;
   in response to the reset pulse, starting the control of the frequency of the clock signal of the local oscillator anew.

8. The frequency detection method according to claim 1, which comprises:
   providing a phase locked loop with a phase detector and a loop low-pass filter; and
   using an adder to feed the analog output signal to the loop low-pass filter in the phase locked loop, as a result of which the frequency of the clock signal of the local oscillator is modified until it has adjusted to a data rate of the received data signal.

9. The frequency detection method according to claim 8, which comprises:
   when the phase locked loop locks, deriving a lock signal; and
   feeding the lock signal as a reset signal to the counters operating in parallel to terminate the control of the frequency of the clock signal of the local oscillator.

10. The frequency detection method according to claim 1, which comprises:
    providing a plesiochronous counter;
    after a number of clock signal pulses have been detected from the plesiochronous counter, outputting a reset pulse to reset the counters which operate in parallel;
    in response to the reset pulse, starting the control of the frequency of the clock signal of the local oscillator anew.

11. A frequency detector circuit comprising:
    a clock signal path for dividing a frequency of a clock signal applied to the clock signal path from a local oscillator, said clock signal path including, in series, a 1:4 frequency divider, then a precounter, and finally a ring counter having an output providing a counting value;
    a data signal path for dividing a frequency of a received binary data signal, said data signal path including, in series, a precounter that is identical to said precounter in said clock signal path, and a ring counter having an output providing a counting value, said ring counter in said data signal path being identical to said ring counter in said clock signal path;
    a subtractor having a first input connected to said output of said ring counter in said clock signal path and a second input connected to said output of said ring counter in said data signal path, said subtractor outputting a difference between the counting value output by said ring counter in said clock signal path and said counting value output by said ring counter in said data signal path;
    a digital to analog converter receiving said difference from said subtractor and converting said difference into an analog output signal for controlling the frequency of the clock signal of the local oscillator.

12. The frequency detector circuit according to claim 11, comprising:
    a first resettable 1:2-frequency divider connected between said precounter in said clock signal path and said ring counter in said clock signal path; and
    a second resettable 1:2-frequency divider connected between said precounter in said data signal path and said ring counter in said data signal path.

13. The frequency detector circuit according to claim 12, wherein said subtractor is constructed to form said difference between the counting value output by said ring counter in said clock signal path and said counting value output by said ring counter in said data signal path beyond overflow limits.

14. The frequency detector circuit according to claim 11, wherein said subtractor is constructed to form said difference between the counting value output by said ring counter in said clock signal path and said counting value output by said ring counter in said data signal path beyond overflow limits.

15. The frequency detector circuit according to claim 11, wherein said subtractor has a further output providing a reset signal, if said subtractor reaches a specified reading selected from the group consisting of a positive final reading and a negative final reading.

16. The frequency detector circuit according to claim 15, comprising:
    an OR gate; and
    a phase lock loop for providing a lock signal when locking occurs after adjustment of the frequency of the clock signal of the local oscillator has been terminated;
    said precounter in said clock signal path having a reset input, said precounter in said data signal path having a reset input;
    said ring counter in said clock signal path having a reset input, said ring counter in said data signal path having a reset input;
    said OR gate having a first input receiving said lock signal from said phase lock loop and having a second input receiving said reset signal from said further output of said subtractor; and
    said OR gate having an output connected to said reset input of said precounter in said clock signal path, said reset input of said precounter in said data signal path, said reset input of said ring counter in said clock signal path, and said reset input of said ring counter in said data signal path.

17. The frequency detector circuit according to claim 15, comprising:
    a first resettable 1:2-frequency divider connected between said precounter in said clock signal path and said ring counter in said clock signal path, said first resettable 1:2-frequency divider having a reset input; and
    a second resettable 1:2-frequency divider connected between said precounter in said data signal path and said ring counter in said data signal path, said second resettable 1:2-frequency divider having a reset input;

said ring counter in said clock signal path has a reset input, said ring counter in said data signal path has a reset input;

said reset signal from said further output of said subtractor is connected to said reset input of said first resettable 1:2-frequency divider and to said reset input of said second resettable 1:2-frequency divider; and said reset signal from said further output of said subtractor is connected to said reset input of said ring counter in said clock signal path and to said reset input of said ring counter in said data signal path.

18. The frequency detector circuit according to claim 11, comprising:

a plesiochronous counter connected to said output of said precounter in said clock signal path;

said precounter in said clock signal path configured for frequency dividing pulses of the clock signal; and said plesiochronous counter counting pulses of the clock signal after the pulses have been frequency divided by said precounter in said clock signal path, said plesiochronous counter having an output providing a reset signal when a certain number of counted clock signal pulses is reached.

19. The frequency detector circuit according to claim 18, comprising:

a first resettable 1:2-frequency divider connected between said precounter in said clock signal path and said ring counter in said clock signal path, said first resettable 1:2-frequency divider having a reset input; and a second resettable 1:2-frequency divider connected between said precounter in said data signal path and said ring counter in said data signal path, said second resettable 1:2-frequency divider having a reset input;

said ring counter in said clock signal path has a reset input, said ring counter in said data signal path has a reset input;

said reset signal from said further output of said subtractor is connected to said reset input of said first resettable 1:2-frequency divider and to said reset input of said second resettable 1:2-frequency divider; and said reset signal from said further output of said subtractor is connected to said reset input of said ring counter in said clock signal path and to said reset input of said ring counter in said data signal path.

20. The frequency detector circuit according to claim 19, wherein:

said precounter in said clock signal path has a reset input, said precounter in said data signal path has a reset input; and said reset signal from said further output of said subtractor is connected to said reset input of said precounter in said clock signal path and to said reset input of said precounter in said data signal path.

21. The frequency detector circuit according to claim 11, wherein said digital to analog converter converts said difference from said subtractor into an analog voltage, said difference from said subtractor having a most significant bit that functions as a sign bit.

22. The frequency detector circuit according to claim 11, wherein said precounter in said clock signal path and said precounter in said data signal path are each constructed to count up to g/4, where g is an anticipated value of successive identical bits of the received data signal.

23. The frequency detector circuit according to claim 11, wherein said clock signal path, said data signal path, said subtractor, and said digital to analog converter are configured in a receiver circuit at an end of a transmission path of a network selected from the group consisting of a telecommunications network and a data transmission network.

* * * * *

UNITED STATES PATENT AND TRADEMARK OFFICE
CERTIFICATE OF CORRECTION

PATENT NO. : 6,362,693 B2
DATED : March 26, 2002
INVENTOR(S) : Reinhold Unterricker It is certified that error appears in the above-identified patent and that said Letters Patent is hereby corrected as shown below:

<u>Title page,</u>
Item [30] should read as follows:
-- Sept. 25, 1998      DE  .......... 198 44 126 --

Signed and Sealed this

Twenty-seventh Day of August, 2002

Attest:

Attesting Officer

JAMES E. ROGAN
*Director of the United States Patent and Trademark Office*